US008542491B2

(12) United States Patent
Lu

(10) Patent No.: US 8,542,491 B2
(45) Date of Patent: Sep. 24, 2013

(54) STRUCTURE FOR FIXING A BACKPLATE

(75) Inventor: Chien-Yen Lu, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 254 days.

(21) Appl. No.: 12/556,564

(22) Filed: Sep. 9, 2009

(65) Prior Publication Data

US 2011/0057080 A1 Mar. 10, 2011

(51) Int. Cl.
*H05K 7/20* (2006.01)

(52) U.S. Cl.
USPC ...... 361/719; 361/816; 361/818; 248/346.03; 248/188.7; 248/310

(58) Field of Classification Search
USPC .................... 248/346.03, 346.01, 188.1, 688, 248/188.8, 188.7, 188.9, 310, 130, 131
See application file for complete search history.

(56) References Cited

U.S. PATENT DOCUMENTS

| | | | | |
|---|---|---|---|---|
| 1,534,440 | A * | 4/1925 | Carter | 16/42 R |
| 1,574,963 | A * | 3/1926 | Foote | 248/188.7 |
| 1,754,714 | A * | 4/1930 | Gundrup | 248/310 |
| 3,358,951 | A * | 12/1967 | Carter | 248/650 |
| 5,169,115 | A * | 12/1992 | Chung Hsiang | 248/677 |
| 5,603,478 | A * | 2/1997 | Wang | 248/371 |
| 5,881,985 | A * | 3/1999 | Hoenig | 248/371 |
| 5,899,422 | A * | 5/1999 | Eke | 248/188.4 |
| 6,646,881 | B1 * | 11/2003 | Lai et al. | 361/719 |
| 6,791,847 | B2 * | 9/2004 | Ma | 361/816 |
| 7,823,317 | B2 * | 11/2010 | Potterfield et al. | 42/94 |
| 2004/0081529 | A1 * | 4/2004 | Stanton et al. | 411/44 |

* cited by examiner

*Primary Examiner* — Nkeisha Smith

(57) ABSTRACT

A structure for fixing a backplate includes a main body having at least one extended portion, on which at least one retaining arm and at least one locating post are provided. The locating post is located near an outmost portion of an end of the extended portion opposite to the main body, and the retaining arm is located near an outer periphery of the locating post. The backplate can be attached to one face of a motherboard via the locating post and the retaining arm of the structure for fixing a backplate to increase the structural strength of the motherboard without the need of using any bonding material or other adhesive medium to thereby reduce the cost of manufacturing and mounting the backplate.

6 Claims, 5 Drawing Sheets

STRUCTURE FOR FIXING A BACKPLATE

FIELD OF THE INVENTION

The present invention relates to a structure for fixing a backplate, and more particularly to a backplate fixing structure for fixedly attaching to a motherboard to increase the structural strength of the latter without the need of using any bonding material and adhesive medium or fastening elements.

BACKGROUND OF THE INVENTION

With the highly developed semiconductor technology, the currently available integrated circuits (ICs) have a largely reduced volume than before. To enable the ICs to process more data, the number of elements and components included in the current ICs is often several times of that in the conventional ICs having the same volume. However, heat produced by the ICs during operation thereof increases with the growing number of electronic elements and components in the ICs. For example, the heat produced by a common central processing unit (CPU) at full working load is high enough for burning out the whole CPU. Therefore, it is important to develop effective heat radiating means for the ICs. One solution for dissipating the heat produced by the CPU is to provide on the CPU with a heat radiating unit, such as a heat sink, so that the heat produced by the CPU may be quickly removed from the CPU. The heat radiating unit is usually fastened to the motherboard. However, the motherboard is made of a printed circuit board (PCB), which has a relatively low strength and tends to bend and deform at areas to which the heat radiating unit is fastened. In a worse condition, the motherboard would even break due to vibration and other unpredictable external forces. To overcome this problem, it has been tried by persons of ordinary skill in the art to provide a backplate for attaching to one face of the motherboard at an area opposite to the heat radiating unit, so as to increase the structural strength of the motherboard. The conventional backplate is first fixedly attached to one face of the motherboard using a bonding material or a fastening means, such as screws, before the heat radiating unit is correspondingly assembled to the other face of the motherboard. By doing this, additional cost for the bonding material or the fastening means is required. Further, once it is bonded or fastened to the motherboard, the backplate can not be removed for use for a second time.

In brief, the conventional backplate for increasing the structural strength of the motherboard has the following disadvantages: (1) uneasy to mount and requiring more time and labor costs, and (2) requiring increased manufacturing cost.

It is therefore tried by the inventor to develop an improved structure for fixing a backplate to eliminate the disadvantages in the prior art backplate.

SUMMARY OF THE INVENTION

A primary object of the present invention is to provide a structure for fixing a backplate for directly fixedly attaching a backplate to a motherboard without the need of using any bonding material or other adhesive medium or fastening elements.

To achieve the above and other objects, the structure for fixing a backplate according to the present invention includes a main body having at least one extended portion, on which at least one retaining arm and at least one locating post are provided. The locating post is located near an outmost portion of an end of the extended portion opposite to the main body, and the retaining arm is located near an outer periphery of the locating post. The backplate can be fixedly attached to one face of a substrate via the locating post and the retaining arm of the structure for fixing a backplate to increase the structural strength of the substrate without the need of using any bonding material or other adhesive medium to thereby reduce the cost of the backplate.

The structure of fixing a backplate according to the present invention has the following advantages: (1) enabling reduced cost of the backplate; and (2) being easy to mount.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
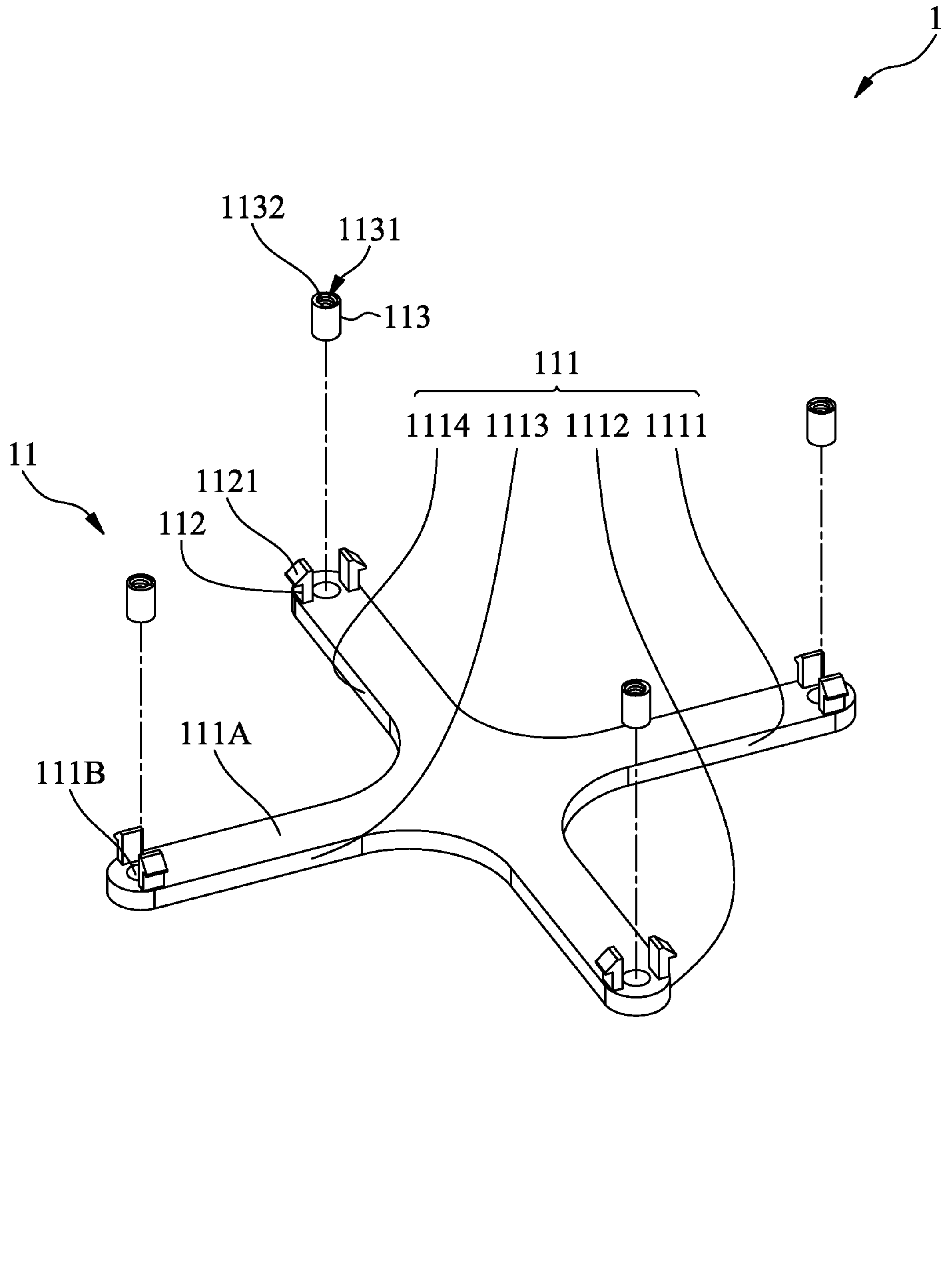
FIG. 1 is an exploded perspective view showing a structure for fixing a backplate according to an embodiment of the present invention.
Figure 2:
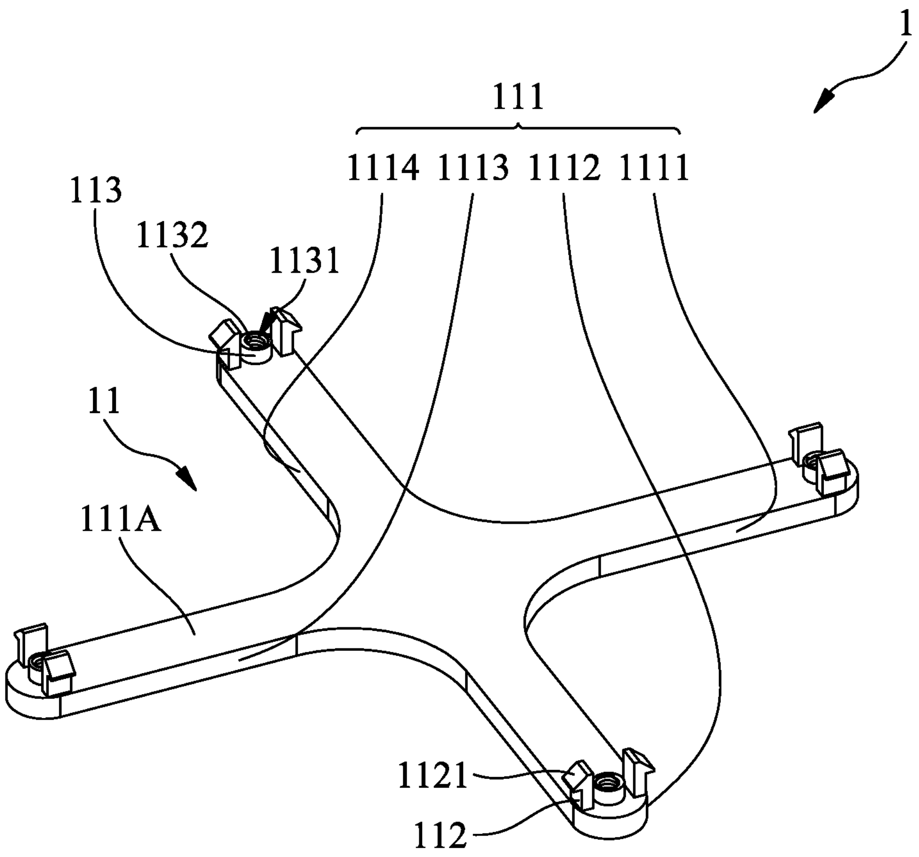
FIG. 2 is an assembled view of FIG. 1.

Please refer to FIGS. 1 and 2 that are exploded and assembled perspective views, respectively, of a structure for fixing a backplate 1 according to an embodiment of the present invention. As shown, the structure for fixing a backplate 1 includes a main body 11 having at least one extended portion 111, on which at least one retaining arm 112 and at least one locating post 113 are provided. The locating post 113 is located near an outmost portion of an end of the extended portion 111 opposite to the main body 11, and the retaining arm 112 is located near an outer periphery of the locating post 113.

Figure 3:
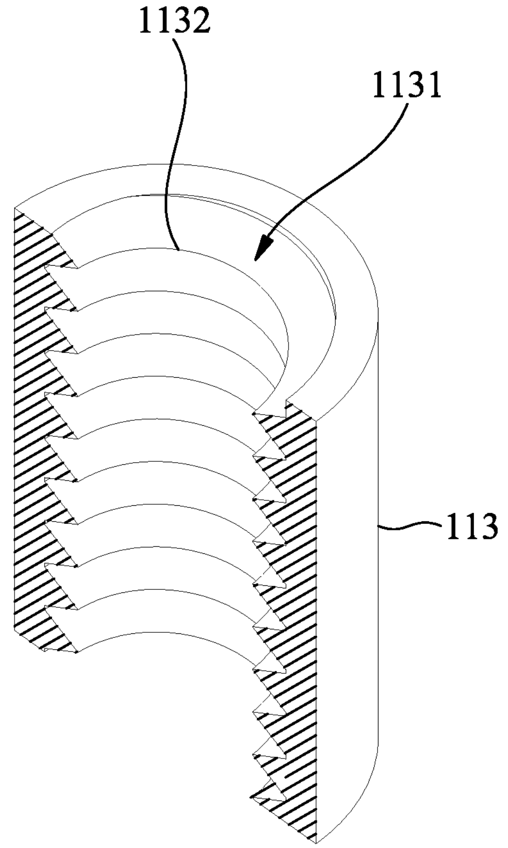
FIG. 3 is a sectioned perspective view of a locating post included in the present invention.

The extended portion 111 further includes a first extended portion 1111, a second extended portion 1112, a third extended portion 1113, and a fourth extended portion 1114, which are separately extended from one side of the main body 11 in directions opposite to the main body 11. The retaining arm 112 is extended from one face 111A of the extended portion 111 in a direction opposite to the face 111A. An end of the retaining arm 112 opposite to the face 111A of the extended portion 111 has at least one hooked end 1121. The retaining arm 112 is perpendicular to the face 111A of the extended portion 111. The hooked end 1121 is located at an outmost portion of an end of the retaining arm 112 not connected to the extended portion, and is perpendicularly extended from the outmost portion of the retaining arm 112. The extended portion 111 is provided with a through hole 111B, and the retaining arm 112 is located at an outer periphery of the through hole 111B. The locating post 113 has at least one bore 1131 therein, and, as can be clearly seen in FIG. 3, a plurality of internal screw threads 1132 is provided in the bore 1131. The locating post 113 is inserted in the through hole 111B. The retaining arm 112 and the extended portion 111 are integrally formed with the main body 11. In another embodiment (not shown), the locating post 113 is also integrally formed with the main body 11.

Figure 4:
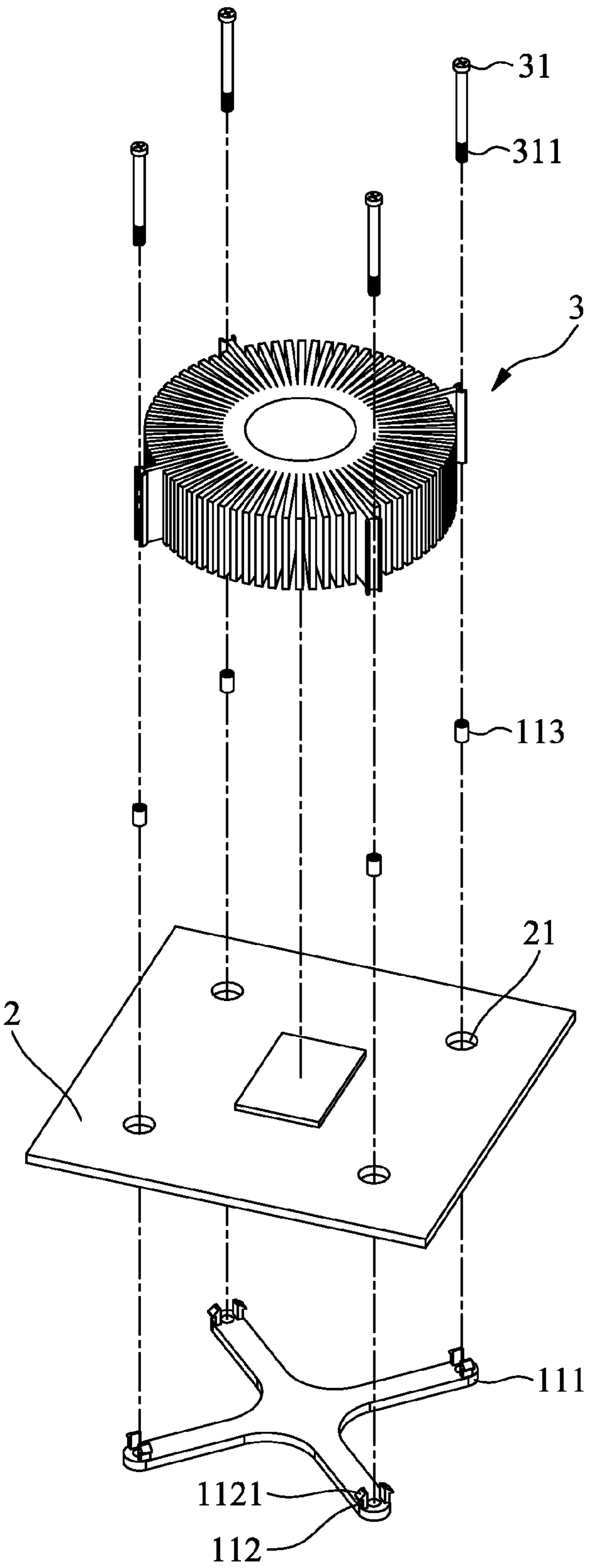
FIG. 4 is an exploded perspective view showing the attachment of the present invention to one face of a motherboard opposite to a heat sink.
Figure 5:
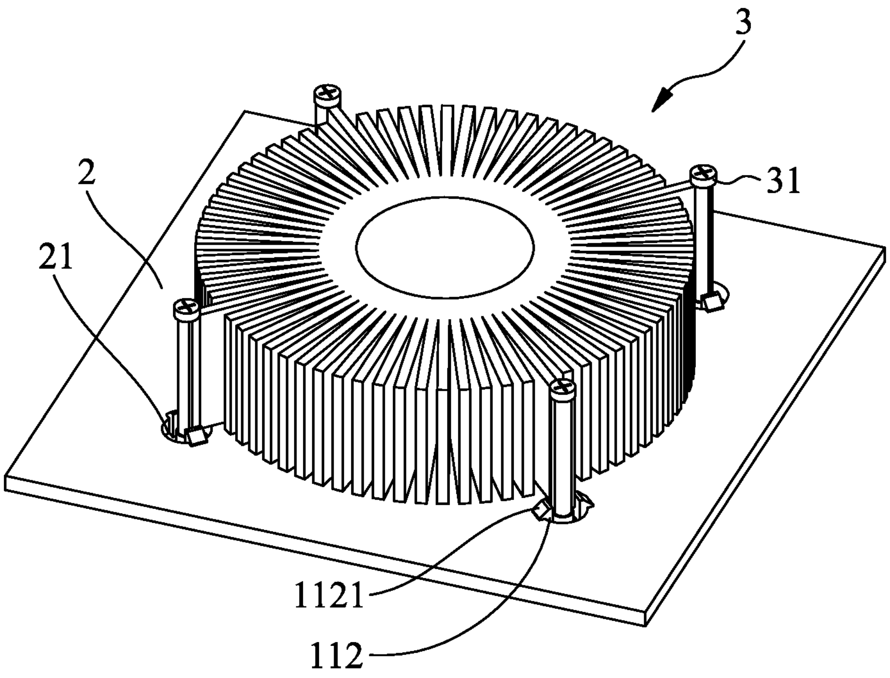
FIG. 5 is an assembled view of FIG. 4.

Please refer to FIGS. 4 and 5. With the structure for fixing a backplate 1 of the present invention, the backplate 1 can be directly fixed to one face of a motherboard 2 and then connected to a heat sink 3 mounted to another opposite face of the motherboard 2. The motherboard 2 is formed with a plurality of through holes 21 to correspond to the retaining arm 112 and the locating post 113 on the extended portion 111. The end of the retaining arm 112 having the hooked end 1121 is extended through the corresponding through hole 21 on the motherboard 2 to fixedly hook to the other face of the motherboard 2 at an area adjoining the outer periphery of the through hole 21. At this point, the locating post 113 can be aligned with a fastening screw 31 on the heat sink 3 used to mount the heat sink 3 to the motherboard 2. The fastening screw 31 is provided at a free end with a plurality of external screw threads 311, which mesh with the internal screw threads 1132 of the locating post 113 when the fastening screw 31 is screwed into the locating post 113. In this manner, the backplate 1 and the heat sink 3 are firmly and stably attached to two opposite faces of the motherboard 2.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A structure for fixing a backplate and a heat sink to a motherboard, comprising a main body having at least one extended portion, on which at least one retaining arm for retaining said backplate to said motherboard and at least one locating post for retaining said heat sink to said backplate are provided; each locating post being located near an outmost portion of an end of the extended portion opposite to the main body, and the retaining arm being located near an outer periphery of the locating post but separate from and not connected to the locating post such that said backplate is retained to said motherboard by a structure different from that retaining said heat sink to said backplate, wherein the locating post has at least one bore therein, and wherein a plurality of internal screw threads is provided in the bore.

2. The structure for fixing a backplate and a heat sink to a motherboard as claimed in claim 1, wherein said main body further comprising a first, a second, a third, and a fourth extended portion, which are separately extended from one side of the main body in directions opposite to the main body.

3. The structure for fixing a backplate and a heat sink to a motherboard as claimed in claim 1, wherein the retaining arm is extended from one face of the extended portion in a direction opposite to that face, and the retaining arm is provided on an end opposite to that face of the extended portion with at least one hooked end, and the retaining arm being perpendicular to that face of the extended portion.

4. The structure for fixing a backplate and a heat sink to a motherboard as claimed in claim 3, wherein the hooked end is located at an outmost portion of an end of the retaining arm that is not connected to the extended portion, and is perpendicularly extended from the outmost portion of the retaining arm.

5. The structure for fixing a backplate and a heat sink to a motherboard as claimed in claim 3, wherein the retaining arm and the extended portion are integrally formed with the main body.

6. The structure for fixing a backplate and a heat sink to a motherboard as claimed in claim 1, wherein the extended portion is provided with a through hole, the retaining aim being located at an outer periphery of the through hole, and the locating post being inserted in the through hole.

* * * * *